(12) United States Patent
Nagasawa et al.

(10) Patent No.: US 10,886,842 B2
(45) Date of Patent: Jan. 5, 2021

(54) POWER SUPPLY CIRCUIT AND CONTROL METHOD FOR POWER SUPPLY CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toshio Nagasawa, Takasaki Gumma (JP); Takuya Hirakawa, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/557,036

(22) Filed: Aug. 30, 2019

(65) Prior Publication Data

US 2020/0295656 A1 Sep. 17, 2020

(30) Foreign Application Priority Data

Mar. 15, 2019 (JP) .................................. 2019-049068

(51) Int. Cl.
*H02M 3/155* (2006.01)
*H02M 3/156* (2006.01)
(Continued)

(52) U.S. Cl.
CPC ............. *H02M 3/156* (2013.01); *H02M 1/32* (2013.01); *H03H 7/0161* (2013.01); *H02M 2001/0025* (2013.01)

(58) Field of Classification Search
CPC ................. H02M 3/156; H02M 3/158; H02M 2001/0025; H02M 1/32; H02M 2001/0032; H02M 3/155–158
See application file for complete search history.

(56) References Cited

U.S. PATENT DOCUMENTS 6,936,997 B2 * 8/2005 Mullett ............... H02M 3/1582
                                                                                             323/222
7,301,312 B2    11/2007   Nishino
7,498,789 B2 * 3/2009 Lee .......................... H02M 1/32
                                                                                             323/283
(Continued)

FOREIGN PATENT DOCUMENTS

JP         2005117784 A      4/2005
JP         2012100400 A      5/2012
(Continued)

*Primary Examiner* — Thienvu V Tran
*Assistant Examiner* — Sisay G Tiku
(74) *Attorney, Agent, or Firm* — Holtz, Holtz & Volek PC

(57) ABSTRACT

A power supply circuit according to an embodiment includes an driver, a control circuit, and a protection circuit. The driver includes a first transistor connected between a high-potential-side power supply and a node and a second transistor connected between a low-potential-side power supply and the node. The control circuit generates, according to an output voltage to a load connected to the node via a first low-pass filter circuit, first and second switching pulses for alternately switching the first and second transistors. The protection circuit outputs, when a voltage of the node via a second low-pass filter circuit exceeds a first reference voltage, an interruption signal for making at least the first transistor nonconductive.

14 Claims, 5 Drawing Sheets

(51) Int. Cl.
  *H02M 3/158* (2006.01)
  *H02M 1/00* (2006.01)
  *H03H 7/01* (2006.01)
  *H02M 1/32* (2007.01)

(56) References Cited

U.S. PATENT DOCUMENTS

| | | | |
|---|---|---|---|
| 7,633,274 B2 | 12/2009 | Nishino | |
| 8,044,642 B2* | 10/2011 | Sakai | H02M 3/1588 323/224 |
| 8,508,209 B2* | 8/2013 | Wang | H02M 1/36 323/284 |
| 2004/0080886 A1* | 4/2004 | Ishikawa | H02M 3/156 361/62 |
| 2009/0189585 A1* | 7/2009 | Huang | H02M 1/32 323/285 |
| 2010/0110593 A1* | 5/2010 | Kim | H02M 1/32 361/18 |
| 2010/0156366 A1* | 6/2010 | Sakai | H02M 3/1588 323/282 |
| 2010/0194364 A1* | 8/2010 | Fukushi | H02M 3/1588 323/282 |
| 2012/0049829 A1* | 3/2012 | Murakami | H02M 1/32 323/288 |
| 2013/0063121 A1* | 3/2013 | Kasai | H02M 1/32 323/311 |
| 2014/0313608 A1* | 10/2014 | Nakabayashi | H02M 3/1584 360/39 |
| 2017/0279352 A1* | 9/2017 | Kosaraju | G01R 19/16571 |

FOREIGN PATENT DOCUMENTS

| | | |
|---|---|---|
| JP | 2013062935 A | 4/2013 |
| JP | 2019022303 A | 2/2019 |

* cited by examiner

US 10,886,842 B2

POWER SUPPLY CIRCUIT AND CONTROL METHOD FOR POWER SUPPLY CIRCUIT

CROSS-REFERENCE TO RELATED APPLICATIONS

This application is based upon and claims the benefit of priority from Japanese Patent Application No. 2019-049068, filed on Mar. 15, 2019; the entire contents of which are incorporated herein by reference.

FIELD

Embodiments of the present invention relate to a power supply circuit and a control method for the power supply circuit.

BACKGROUND

In recent years, a low voltage and a large current have been a trend in integrated circuits represented by a CPU and an FPGA according to the increase in processing speed. On the other hand, a power supply circuit such as a DC-DC converter that supplies electric power to these integrated circuits has been requested to stably supply an output voltage.

Such a power supply circuit monitors an output voltage input via a feedback line and performs adjustment of the output voltage by switching corresponding to a result of the monitoring. However, when the feedback line or the like is disconnected, it is likely that the output voltage is destabilized to break a load or the like.

DETAILED DESCRIPTION

A power supply circuit according to an embodiment includes a driver, a control circuit, and a protection circuit. The driver includes a first transistor connected between a high-potential-side power supply and a node and a second transistor connected between a low-potential-side power supply and the node. The control circuit generates, according to an output voltage to a load connected to the node via a first low-pass filter circuit, first and second switching pulses for alternately switching the first and second transistors. The protection circuit outputs, when a voltage of the node via a second low-pass filter circuit exceeds a first reference voltage, an interruption signal for making at least the first transistor nonconductive.

First Embodiment

Figure 1:
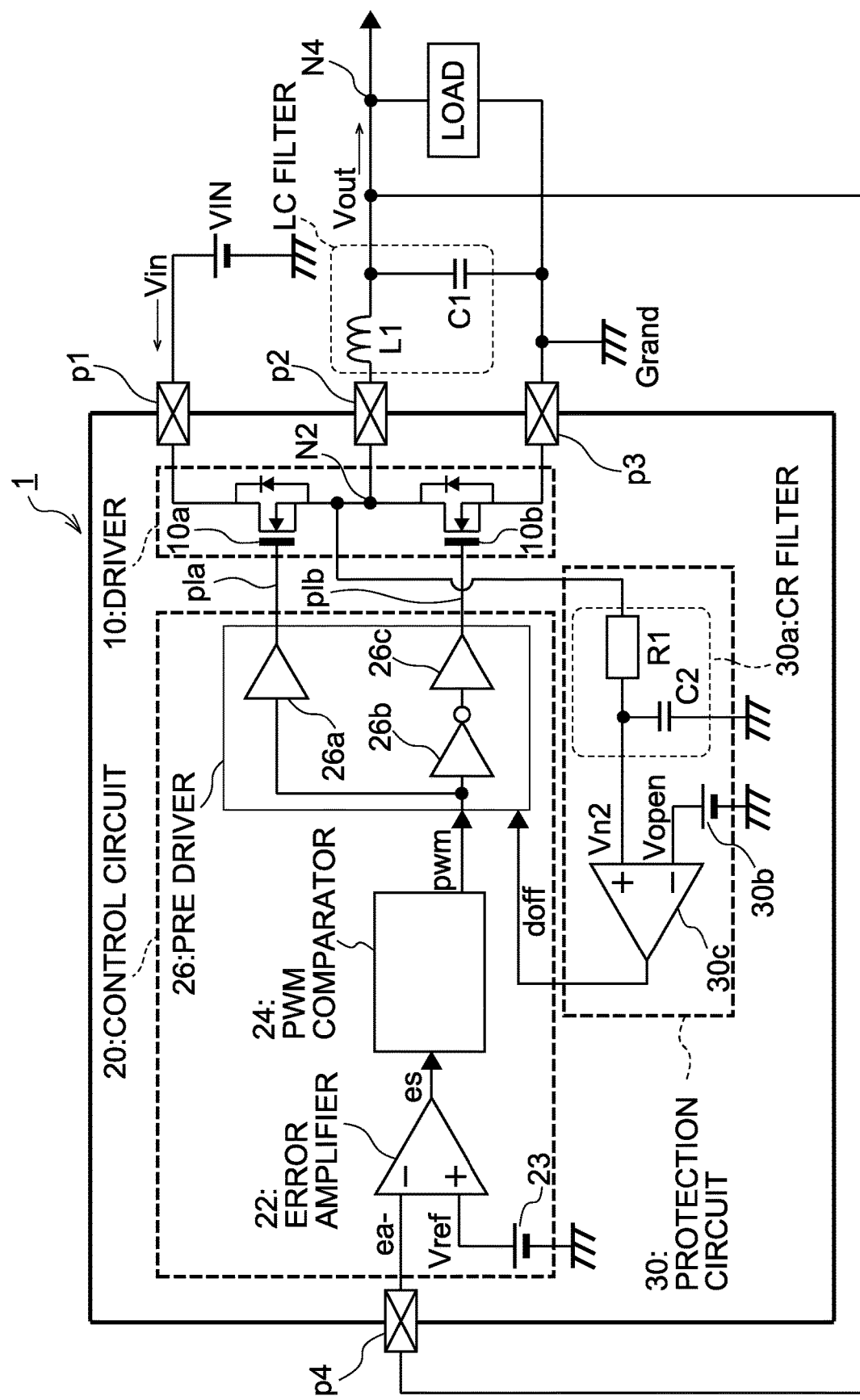
FIG. 1 is a configuration diagram of a power supply circuit according to a first embodiment.

FIG. 1 is a configuration diagram of a power supply circuit 1 according to a first embodiment. The power supply circuit 1 is a circuit that supplies an output voltage Vout from a high-potential-side power supply VIN to a load. The power supply circuit 1 includes a driver 10, a control circuit 20, and a protection circuit 30.

The driver 10 includes first and second transistors 10a and 10b connected in series between the high-potential-side power supply VIN and a low-potential-side power supply Grand. The first and second transistors 10a and 10b are, for example, MOSFETs. A node N2, which is a connection point of the transistors 10a and 10b, is an output node of the driver 10 and is connected to a terminal p2. An LC filter (a first low-pass filter circuit) including an inductor L1 and a capacitor C1 and a load are connected to the node N2 via the terminal p2. In other words, the inductor L1 is connected between the node N2 and a node N4. The capacitor C1 and the load are connected in parallel between the node N4 and the power supply Grand. The output voltage Vout is supplied to the load via the LC filter.

The driver 10 is provided in a semiconductor chip in which the power supply circuit 1 is formed. However, not only this, but the driver 10 may be provided outside the semiconductor chip. On the other hand, the LC filter and the power supply VIN are provided outside the semiconductor chip. However, not only this, but the LC filter and the power supply VIN may be provided in the semiconductor chip.

The control circuit 20 generates, according to the output voltage Vout to the load, first and second switching pulses pla and plb for alternately turning on and off the first and second transistors 10a and 10b. The control circuit 20 includes an error amplifier 22, a second power supply 23, a PWM comparator 24, and a pre diver circuit 26.

The error amplifier 22 outputs an error signal es corresponding to a difference between an input voltage ea– input to a minus terminal and a second reference voltage Vref of the second power supply 23 input to a plus terminal. When a feedback line FBL is not disconnected, the input voltage ea– is a voltage equivalent to the output voltage Vout.

The PWM comparator 24 compares, for example, a not-shown sw signal (sw: sawtooth wave) and the error signal es and generates a pulse signal pwm. For example, the PWM comparator 24 sets a high period of the pulse signal pwm longer as the error signal es increases.

The pre diver circuit 26 generates the first and second switching pulses pla and plb based on the pulse signal pwm. The first transistor 10a is turned on in a high period of the first switching pulse pla and turned off in a low period of the first switching pulse pla. Similarly, the second transistor 10b is turned on in a high period of the second switching pulse plb and turned off in a low period of the second switching pulse plb. A high signal turns on the transistors 10a and 10b. A low signal turns off the transistors 10a and 10b.

When the first transistor 10a is turned on and the second transistor 10b is turned off, the node N2 has potential Vin of the power supply VIN and an electric current flows to the inductor L1. After the first transistor 10a is turned on, the electric current flowing to the inductor L1 gradually increases. Thereafter, when the first transistor 10a is turned off and the second transistor 10b is turned on, an electric current from the second transistor 10b flows to the inductor L1.

The high period of the pulse signal pwm becomes longer as the error signal es increases. In other words, the pre diver circuit 26 generates the first and second switching pulses pla and plb to set an ON time of the first transistor 10a longer as the output voltage Vout drops.

The pre diver circuit 26 includes drivers 26a and 26c and an inverter 26b. The driver 26a amplifies the pulse signal pwm and generates the first switching pulse pla. The inverter 26b and the driver 26c are connected in series and invert and amplify the pulse signal pwm and generate the second switching pulse plb.

The pre diver circuit 26 has a normal mode, a diode emulation mode, a first protection mode, and a second protection mode. Patterns of signals generated by the pre diver circuit 26 are different according to the four modes.

In the normal mode, the pre diver circuit 26 alternately generates the first switching pulse pla and the second switching pulse plb of the high signal. On the other hand, in the diode emulation mode, the pre diver circuit 26 alternately generates the first switching pulse pla and the second switching pulse plb of the high signal and thereafter changes both of the first and second switching pulses pla and plb to a low signal. In the diode emulation mode, the number of times of switching of the driver 10 decreases more than the number of times of switching in the normal mode. It is possible to reduce a switching loss.

The first and second protection modes are signal generation modes at the time when an interruption signal doff is input from the protection circuit 30. In the first protection mode, the pre diver circuit 26 always sets the first and second switching pulses pla and plb to the low signal. Consequently, application of voltages from the power supply VIN and the power supply Grand is stopped and the load is protected.

In the second protection mode, the pre diver circuit 26 always sets the first switching pulse pla to the low signal and always sets the second switching pulse plb to the high signal. In the second protection mode, the power supply VIN is always interrupted, the voltage of the power supply Grand is always applied to the load, and damage to the load is suppressed. An electric current of the inductor L1 is prevented from flowing back via the second transistor 10b. Switching of these modes is performed by an input signal from a not-shown instructor.

The protection circuit 30 includes a CR filter 30a, a first power supply 30b, and a comparator 30c. The protection circuit 30 outputs, when a voltage of the node N2 via the CR filter 30a which is a second low-pass filter circuit exceeds a first reference voltage Vopen of the first power supply 30b, the interruption signal doff for turning off at least the first transistor 10a.

The CR filter 30a has a cutoff frequency, which is, for example, 0.1 times as large as a switching frequency in the driver 10. Consequently, the CR filter 30a supplies a DC component of the voltage in the node N2 to the comparator 30c as a smoothing voltage Vn2.

The comparator 30c compares the smoothing voltage Vn2 and the first reference voltage Vopen. The comparator 30c outputs the interruption signal doff when the smoothing voltage Vn2 exceeds the first reference voltage Vopen. A threshold voltage th may be added to the first reference voltage Vopen to obtain the first reference voltage Vopen. Consequently, it is possible to adjust the first reference voltage Vopen.

Figure 2:
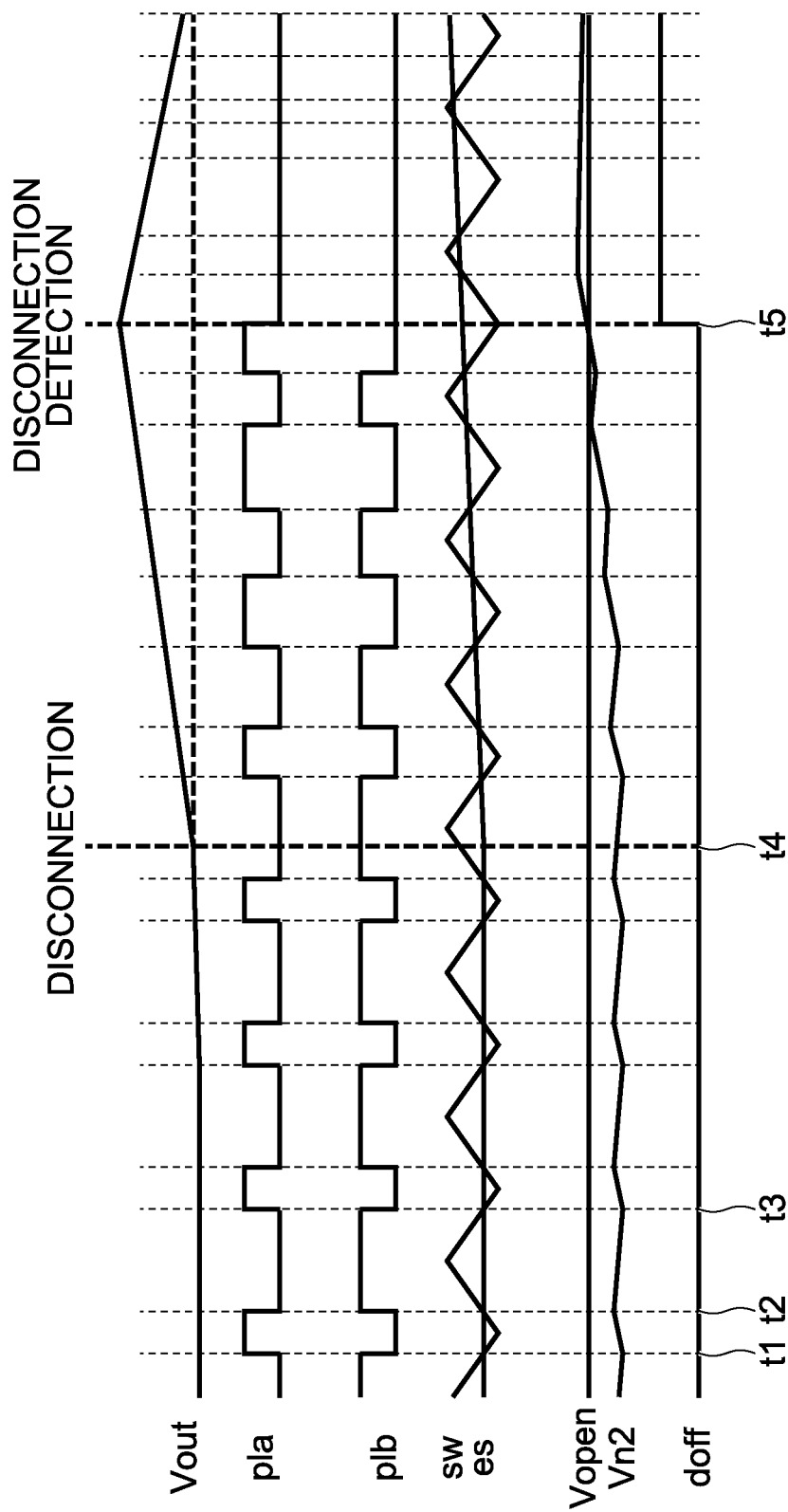
FIG. 2 is a time chart showing an example of disconnection detection.

An operation example of the power supply circuit 1 is explained below. FIG. 2 is a time chart showing an example of disconnection detection. The output voltage Vout, the first and second switching pulses pla and plb, the sw signal, the error signal es, the first reference voltage Vopen, the smoothing voltage Vn2, and the interruption signal doff are shown in FIG. 2.

At time t5, disconnection of the feedback line FBL is detected. An example is explained in which the power supply circuit 1 operates in the first protection mode after time t5. The power supply circuit 1 is in the normal mode up to time t5. The first and second switching pulses alternately have periods of the high signal and the low signal. In a period in which the sw signal is lower than the error signal es, the first switching pulse pla is the high signal and the second switching pulse plb is the low signal. In a period in which the sw signal is higher than the error signal es, the first switching pulse pla is the low signal and the second switching pulse plb is the high signal.

The output voltage Vout up to time t5 is generated based on multiplication of duty Du and an input voltage Vin indicated by Expression (1). The duty Du is a ratio of the high period to one cycle of the first switching pulse pla. In other words, the output voltage Vout becomes higher as the high period of the first switching pulse becomes longer.

[Expression. 1]

$$Vout = Du \times Vin \qquad (1)$$

The error signal es has a substantially fixed value up to time t4 when the feedback line FBL is disconnected. Since the duty Du is kept at a substantially fixed value, the output voltage Vout stabilizes at a substantially fixed value.

When the feedback line FBL is disconnected, the output voltage Vout gradually approaches 0 potential and a value of the error signal es starts to increase. Consequently, the duty Du becomes larger and the output voltage Vout also gradually becomes higher according to an increase in a period in which the sw signal is lower than the error signal es.

The smoothing voltage Vn2 and the output voltage Vout are associated. Therefore, the smoothing voltage Vn2 also becomes higher when the output voltage Vout becomes higher. Disconnection is detected at time t5 when the smoothing voltage Vn2 becomes higher than the first reference voltage Vopen. The interruption signal doff is output from the protection circuit 30. When the interruption signal doff is output, the pre diver circuit 26 changes to the first protection mode. The first and second switching pulses pla and plb are always the low signals. Consequently, the output voltage Vout gradually decreases to 0.

In this way, when the feedback line FBL is disconnected, since the input terminal voltage ea– gradually approaches 0 potential, the error signal es starts to increase and the output voltage Vout increases until the output voltage Vout reaches the input voltage Vin. This is likely to break the load. However, the interruption signal doff is output at a point in time when the smoothing voltage Vn2 becomes higher than the first reference voltage Vopen and the first and second transistors 10a and 10b are turned off. Consequently, the output voltage Vout drops. It is possible to prevent the load from being broken.

Figure 3:
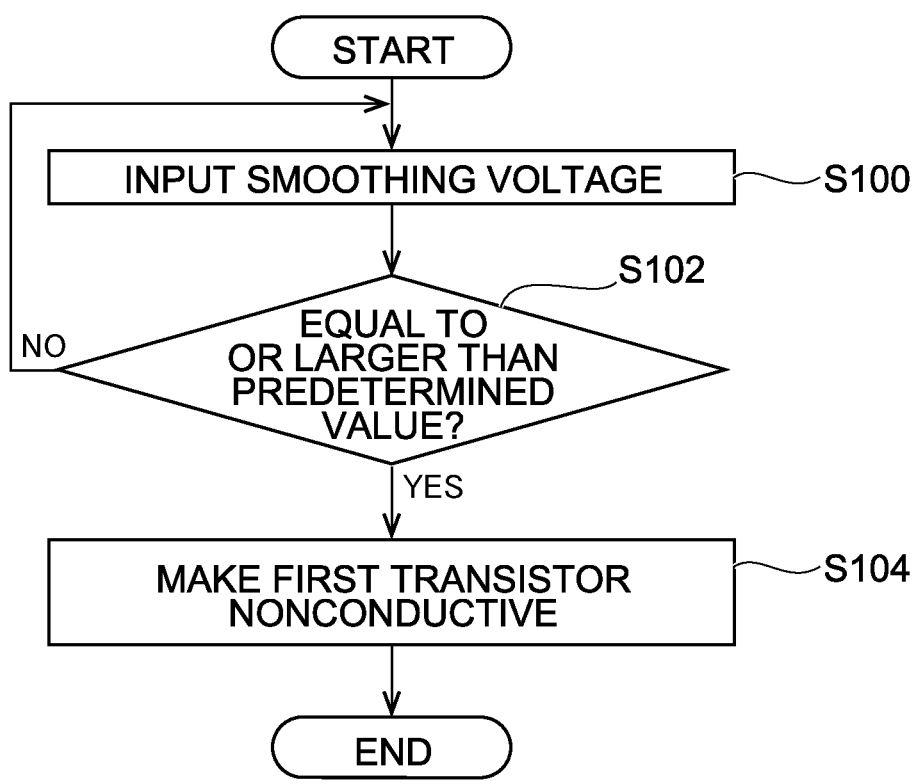
FIG. 3 is a flowchart showing a control example of the power supply circuit.

FIG. 3 is a flowchart showing an example of a control method for the power supply circuit 1. First, the comparator 30c inputs the DC component of the voltage in the node N2 as the smoothing voltage Vn2 (S100). Subsequently, the comparator 30c compares the smoothing voltage Vn2 and a voltage Th having a predetermined value based on the first reference voltage Vopen (S102). If the smoothing voltage Vn2 is smaller than the predetermined value (NO in S102), the power supply circuit 1 repeats the processing from S100. On the other hand, if the smoothing voltage Vn2 is equal to or larger than the predetermined value (YES in S102), the power supply circuit 1 outputs the interruption signal doff for turning off at least the first transistor 10a (S104) and ends the entire processing.

As explained above, according to this embodiment, when the smoothing voltage Vn2 of the node N2, to which the first and second transistors 10a and 10b are connected, exceeds the first reference voltage Vopen, the protection circuit 30 outputs the interruption signal doff for turning off at least the first transistor 10a. Consequently, even if the feedback line FBL is disconnected, the output voltage Vout does not rise to the input voltage Vin and approaches the voltage of the power supply Grand or 0 voltage. Therefore, it is possible to prevent damage to the load.

Second Embodiment

The power supply circuit 1 according to a second embodiment is different from the power supply circuit 1 according to the first embodiment in that, whereas the first reference voltage Vopen is a fixed voltage in the comparator 30c according to the first embodiment, the first reference voltage Vopen is a variable voltage in the comparator 30c according to the second embodiment. Differences from the power supply circuit 1 according to the first embodiment are explained below.

Figure 4:
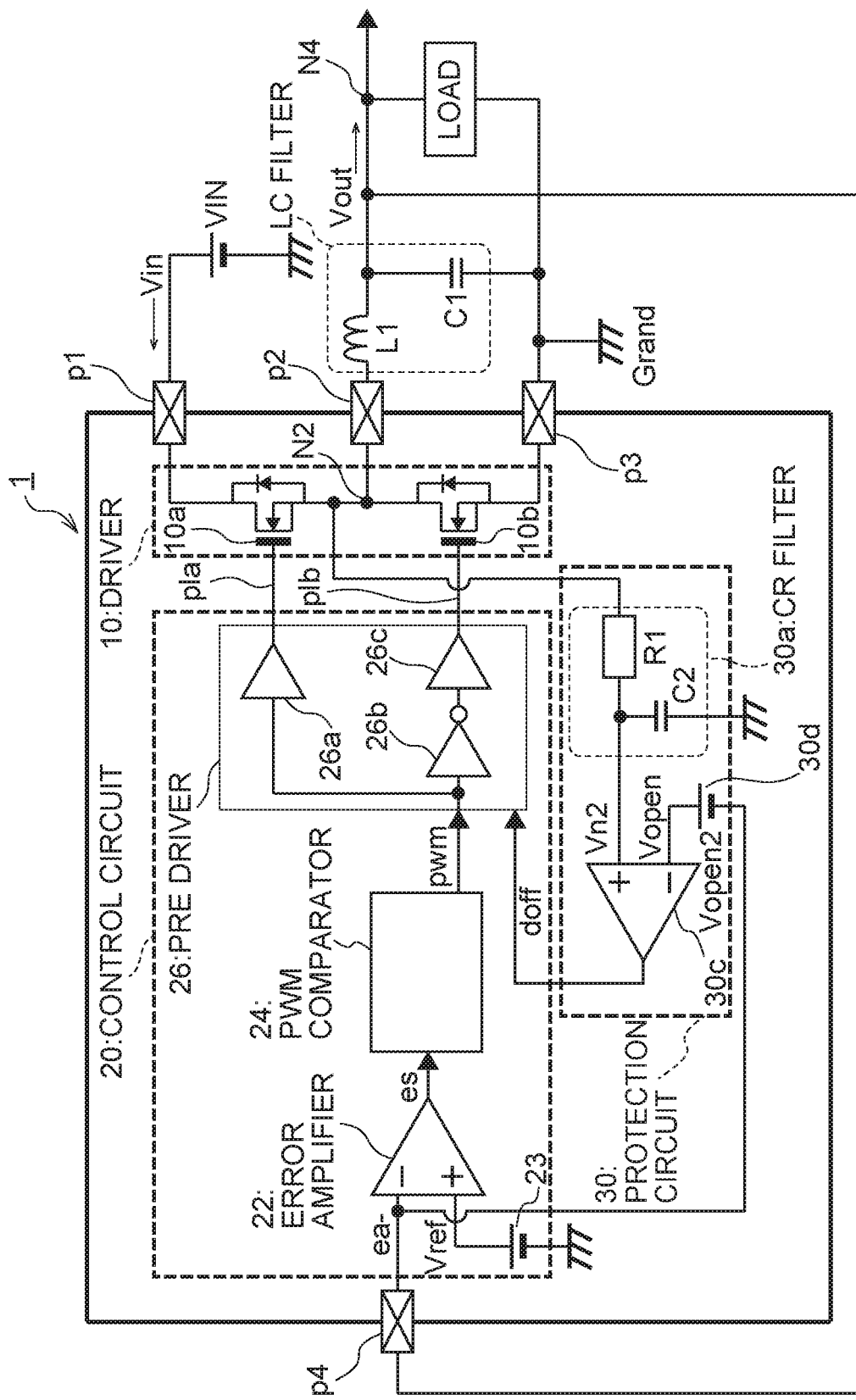
FIG. 4 is a configuration diagram of a power supply circuit according to a second embodiment.

FIG. 4 is a configuration diagram of the power supply circuit 1 according to the second embodiment. The first reference voltage Vopen, which is an input to a minus terminal of the comparator 30c, is an added-up voltage of the input terminal voltage ea– to the minus terminal of the error amplifier 22 and a third reference voltage Vopen2 of a third power supply 30d.

Figure 5:
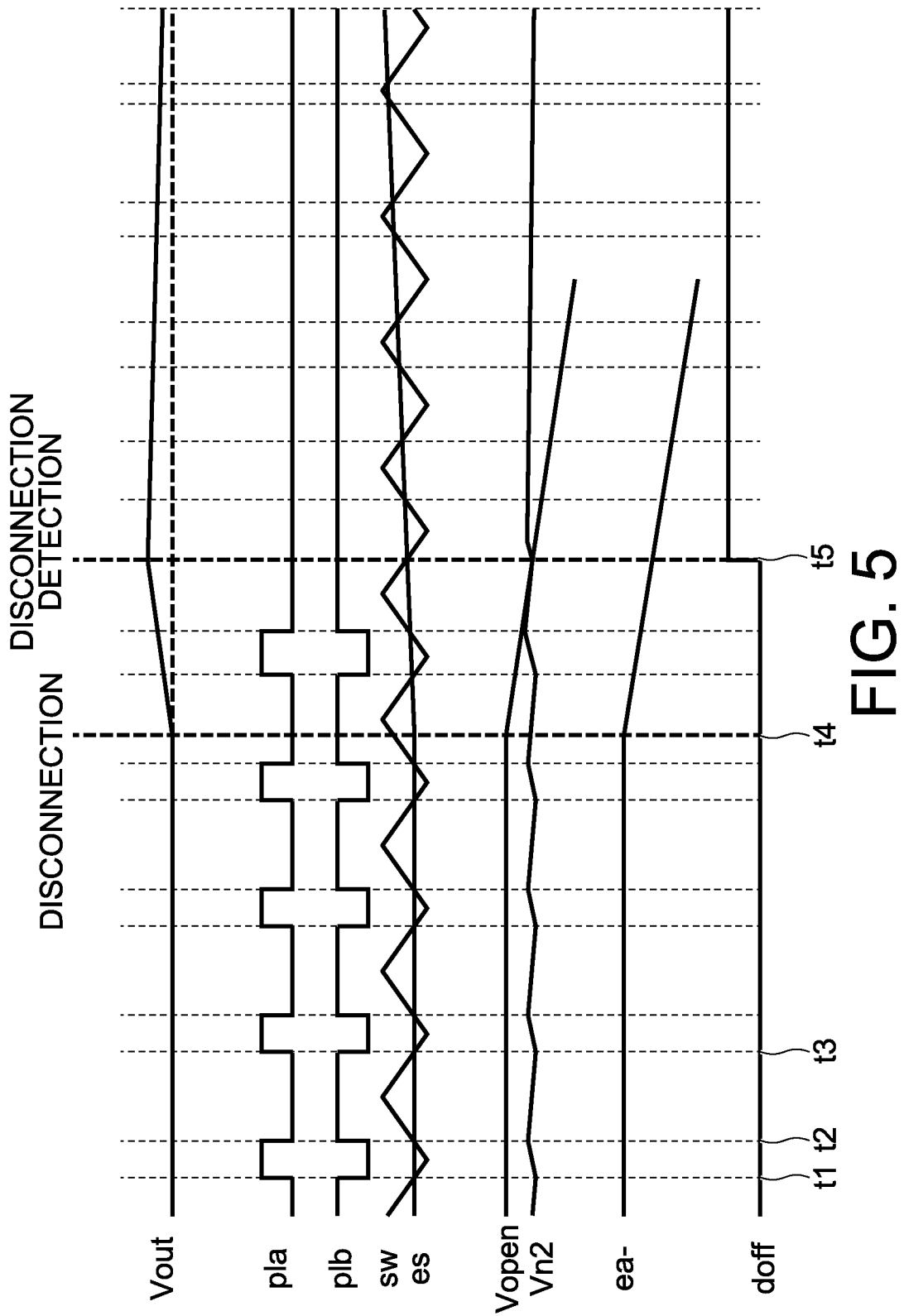
FIG. 5 is a time chart showing an example of disconnection detection according to the second embodiment.

FIG. 5 is a time chart showing an example of disconnection detection according to the second embodiment. The output voltage Vout, the first and second switching pulses pla and plb, the sw signal, the error signal es, the first reference voltage Vopen, the smoothing voltage Vn2, the input terminal voltage ea–, and the interruption signal doff are shown in FIG. 5.

An example is explained in which the power supply circuit 1 operates in the second protection mode after time t5. The input terminal voltage ea– to the minus terminal of the error amplifier 22 drops to 0 voltage when the feedback line FBL is disconnected at time t4. Consequently, the first reference voltage Vopen also starts to drop. A time from the disconnection time t4 until time t5 when the smoothing voltage Vn2 exceeds the first reference voltage Vopen is further reduced than when the first reference voltage Vopen is set to a fixed voltage. Therefore, an increase in the output voltage Vout is also suppressed and damage to the load is suppressed. Disconnection is detected at time t5 when the smoothing voltage Vn2 becomes higher than the first reference voltage Vopen. The interruption signal doff is output from the protection circuit 30. When the interruption signal doff is output, the pre diver circuit 26 changes to the second protection mode.

As explained above, according to this embodiment, the first reference voltage Vopen of the comparator 30c is set to the added-up voltage of the input terminal voltage ea– and the third reference voltage Vopen 2. Consequently, the time from the disconnection time t4 until time t5 when the smoothing voltage Vn2 exceeds the first reference voltage Vopen is reduced. Consequently, an increase in the output voltage Vout is also further suppressed. It is possible to prevent breakage of the load.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A power supply circuit comprising:
    a driver including first and second transistors connected in series between a high-potential-side power supply and a low-potential-side power supply;
    a control circuit configured to generate, according to an output voltage output from the driver via a first low-pass filter circuit, first and second switching pulses for controlling ON and OFF of the first and second transistors; and
    a protection circuit configured to, when the output voltage smoothed by a second low-pass filter circuit exceeds a first reference voltage, output an interruption signal for turning off at least the first transistor to the control circuit,
    wherein the control circuit, when the interruption signal is input:
        in a first protection mode, generates the first and second switching pulses for turning off the first and second transistors, and
        in a second protection mode, generates the first switching pulse for turning off the first transistor and generates the second switching pulse for turning on the second transistor.

2. The power supply circuit according to claim 1, wherein the control circuit includes:
    an error amplifier configured to output an error signal corresponding to a difference between the output voltage input to a first terminal and a second reference voltage input to a second terminal;
    a PWM comparator configured to compare a sawtooth wave signal and the error signal and to generate a pulse signal; and
    a pre diver circuit configured to generate the first and second switching pulses based on the pulse signal, and
    wherein the pre diver circuit generates, when the interruption signal is input, the first switching pulse for turning off the first transistor.

3. The power supply circuit according to claim 2, wherein the pre diver circuit generates, when the interruption signal is input, the second switching pulse for turning on the second transistor.

4. The power supply circuit according to claim 1, wherein the protection circuit includes:
    the second low-pass filter circuit configured to smooth a DC component of the output voltage; and
    a comparator configured to compare the output voltage smoothed by the second low-pass filter circuit and the first reference voltage and, when the smoothed output voltage exceeds the first reference voltage, to output the interruption signal.

5. The power supply circuit according to claim 1, wherein the first reference voltage is a variable voltage based on the output voltage, and
    wherein the protection circuit includes:
        the second low-pass filter circuit configured to smooth a DC component of the output voltage; and
        a comparator configured to compare the output voltage smoothed by the second low-pass filter circuit and the first reference voltage and, when the smoothed output voltage exceeds the first reference voltage, to output the interruption signal.

6. The power supply circuit according to claim 5, wherein the first reference voltage is based on the output voltage and a third reference voltage.

7. The power supply circuit according to claim 1, wherein in a normal mode, the control circuit generates the first and second switching pulses for alternately turning on the first and second transistors, and
wherein in a diode emulation mode, the control circuit generates the first and second switching pulses for alternately turning on the first and second transistors and thereafter generates the first and second switching pulses for turning off both of the first and second transistors.

8. A control method for a power supply circuit including first and second transistors connected in series between a high-potential-side power supply and a low-potential-side power supply, the control method comprising:
generating, according to an output voltage, first and second switching pulses for alternately switching the first and second transistors; and
outputting, when the output voltage, which is smoothed, exceeds a first reference voltage, an interruption signal for turning off at least the first transistor,
wherein, in the generating the first and second switching pulses, when the interruption signal is input:
in a first protection mode, the first and second switching pulses for turning off the first and second transistors are generated, and
in a second protection mode, the first switching pulse for turning off the first transistor is generated and the second switching pulse for turning on the second transistor is generated.

9. The control method for the power supply circuit according to claim 8, wherein the generating the first and second switching pulses includes:
outputting an error signal corresponding to a difference between the output voltage input to a first terminal via a feedback line and a second reference voltage input to a second terminal via the feedback line;
comparing a sawtooth wave signal and the error signal and generating a pulse signal; and
generating the first and second switching pulses that is brought into a state at nonconduction time, when the interruption signal is input, based on the pulse signal.

10. The control method for the power supply circuit according to claim 9, wherein, in the generating the first and second switching pulses, when the interruption signal is input, the second switching pulse for turning on the second transistor is generated.

11. The control method for the power supply circuit according to claim 8, wherein the outputting the interruption signal includes:
smoothing a DC component of the output voltage; and
comparing the smoothed output voltage and the first reference voltage and, when the smoothed output voltage exceeds the first reference voltage, outputting the interruption signal.

12. The control method for the power supply circuit according to claim 8, wherein the first reference voltage is a variable voltage based on the output voltage, and
wherein the outputting the interruption signal includes:
smoothing a DC component of the output voltage; and
comparing the smoothed output voltage and the first reference voltage and, when the smoothed output voltage exceeds the first reference voltage, outputting the interruption signal.

13. The control method for the power supply circuit according to claim 12, wherein the first reference voltage is based on the output voltage and a third reference voltage.

14. The control method for the power supply circuit according to claim 8, wherein, in the generating the first and second switching pulses:
in a normal mode, the first and second switching pulses for alternately turning on the first and second transistors are generated, and
in a diode emulation mode, the first and second switching pulses for alternately turning on the first and second transistors are generated and thereafter the first and second switching pulses for turning off both of the first and second transistors are generated.

* * * * *